United States Patent [19]

Nakanishi et al.

[11] Patent Number: 5,534,452

[45] Date of Patent: Jul. 9, 1996

[54] METHOD FOR PRODUCING SEMICONDUCTOR DEVICE

[75] Inventors: Mamiko Nakanishi, Itami; Yasutaka Kohno, deceased, late of Saijyo, both of Japan, by Yoko Kohno, heir/legal representative

[73] Assignee: Mitsubishi Denki Kabushiki Kaisha, Tokyo, Japan

[21] Appl. No.: 534,212

[22] Filed: Sep. 26, 1995

[30] Foreign Application Priority Data

Oct. 11, 1994 [JP] Japan .................................... 6-245443

[51] Int. Cl.$^6$ ............................................. H01L 21/8232
[52] U.S. Cl. ......................... 437/40 R; 437/41; 437/234; 437/912
[58] Field of Search .................. 437/40 RG, 41 RG, 437/41 SH, 40 SH, 912, 203, 234

[56] References Cited

U.S. PATENT DOCUMENTS

| | | | |
|---|---|---|---|
| 4,616,400 | 10/1986 | Macksey et al. | 437/40 RG |
| 5,006,478 | 4/1991 | Kobayashi et al. | 437/41 SH |
| 5,240,869 | 8/1993 | Nakatani | 437/41 SH |

FOREIGN PATENT DOCUMENTS

| | | |
|---|---|---|
| 61-104675 | 5/1986 | Japan .................. 437/40 SH |
| 64-7664 | 1/1989 | Japan . |
| 1133374 | 6/1989 | Japan . |
| 513445 | 1/1993 | Japan . |

Primary Examiner—Tom Thomas
Assistant Examiner—Michael Trinh
Attorney, Agent, or Firm—Leydig, Voit & Mayer

[57] ABSTRACT

A method for producing a semiconductor device includes preparing a semi-insulating substrate having an active layer, depositing a first insulating film on the active layer and forming two first openings in the first insulating film, depositing a second insulating film on the first insulating film filling the first openings and make a flat surface with the surface of the first insulating film, removing a portion of the first insulating film between the first openings to form a second opening, etching the active layer through the second opening formed by the removal of the first insulating film, removing parts of the second insulating film on opposite sides of the first insulating film from the active layer to form a third opening, and etching the active layer through the third opening formed by removal of the second insulating film to form a double-stage recess. The widths of the first and second stage recesses are determined by the pattern of the first insulating film and the patterns of the first and second insulating films, respectively, so that only one alignment step is sufficient and the positions and the widths of the recess are easily controlled, enhancing the degree of freedom in the recess width.

7 Claims, 8 Drawing Sheets

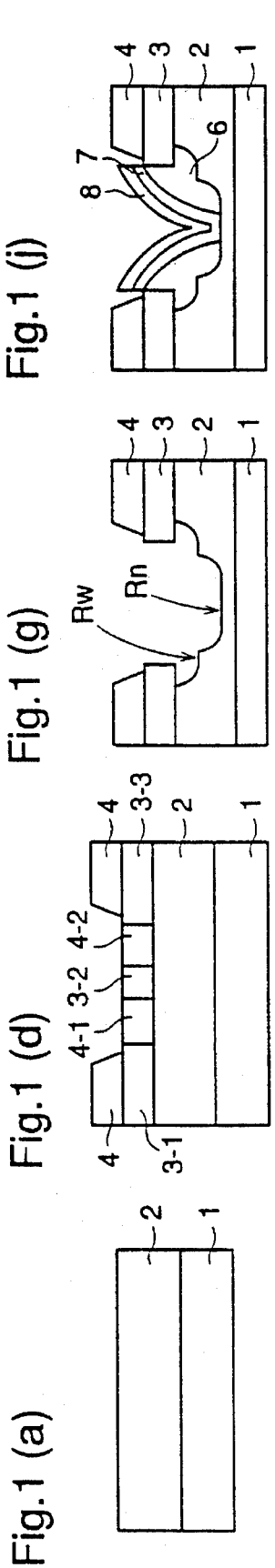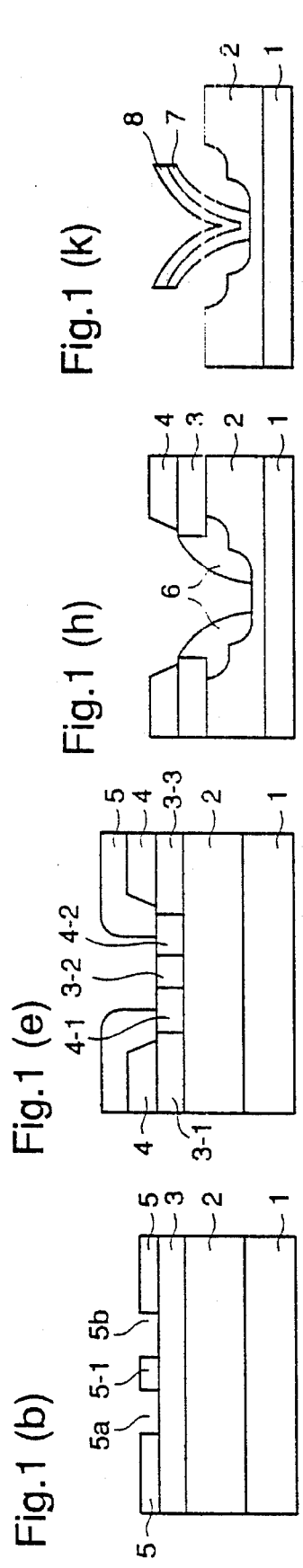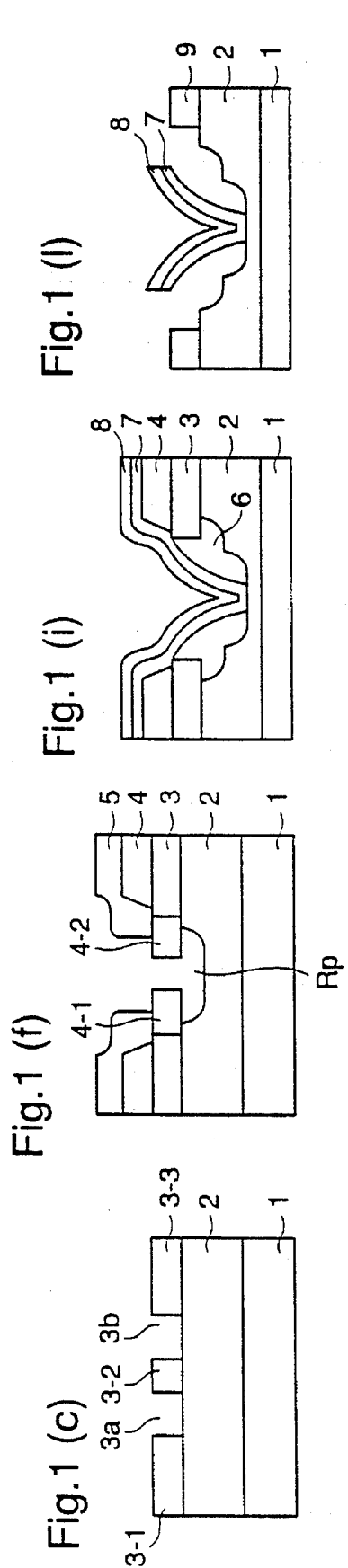

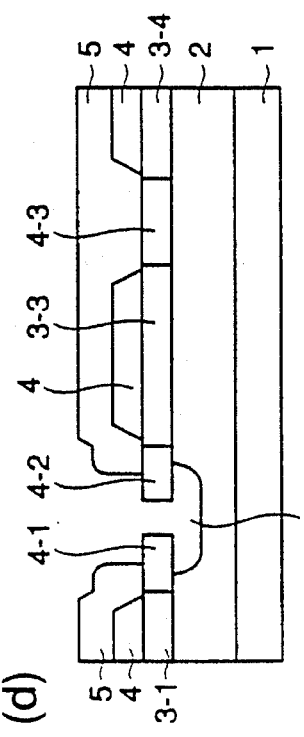
Fig.8 (a)
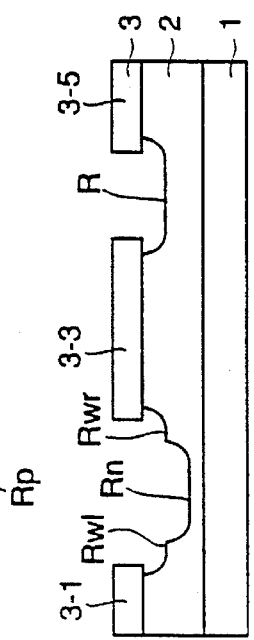
Fig.8 (b)
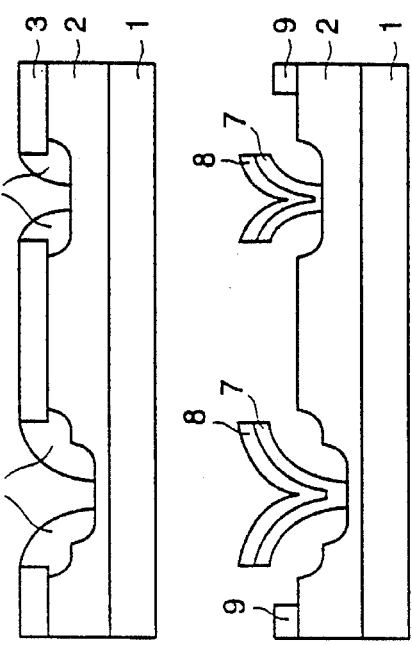
Fig.8 (c)
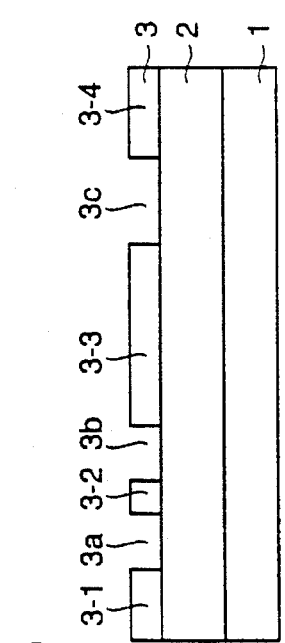
Fig.8 (d)
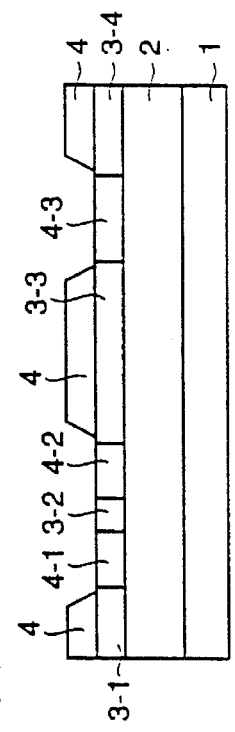
Fig.8 (e)
Fig.8 (f)
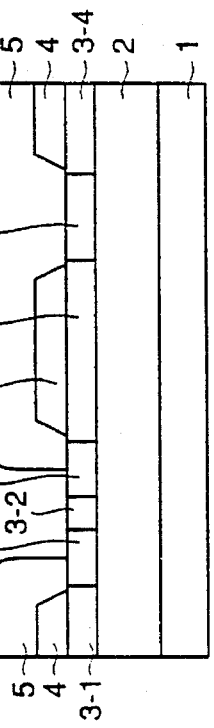
Fig.8 (g)

Fig.9 (a)(PRIOR ART)
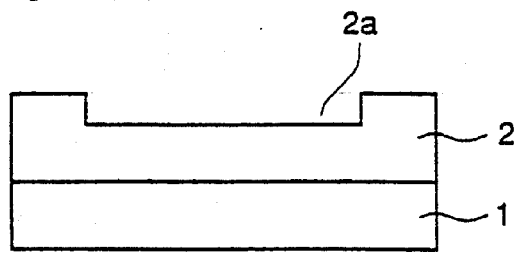
Fig.9 (f)(PRIOR ART)
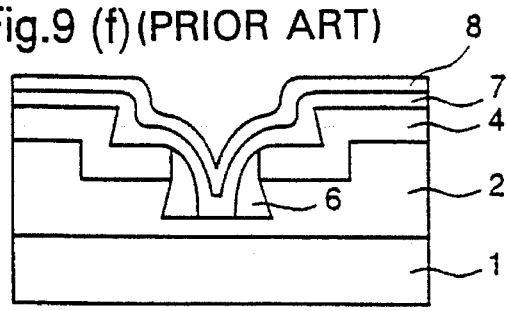
Fig.9 (b)(PRIOR ART)
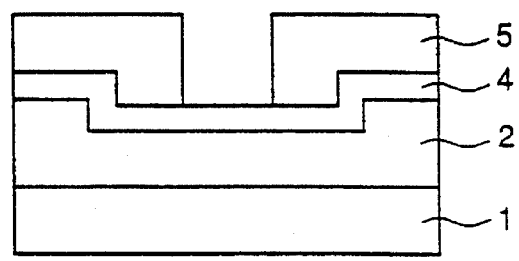
Fig.9 (g)(PRIOR ART)
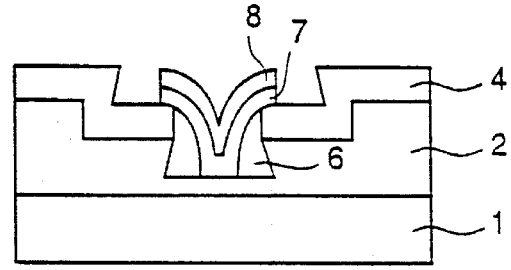
Fig.9 (c)(PRIOR ART)
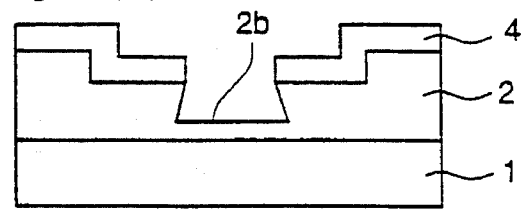
Fig.9 (h) (PRIOR ART)
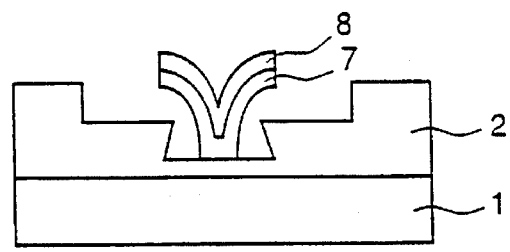
Fig.9 (d)(PRIOR ART)
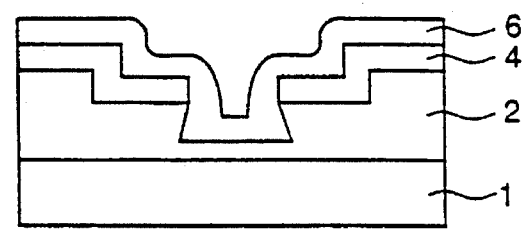
Fig.9 (i) (PRIOR ART)
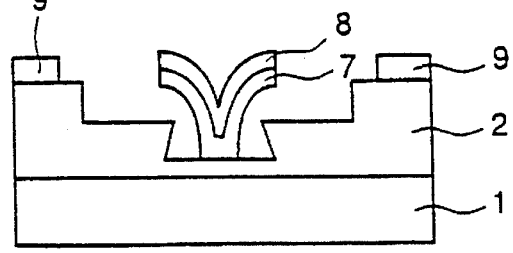
Fig.9 (e)(PRIOR ART)
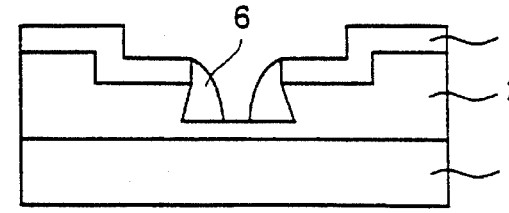

METHOD FOR PRODUCING SEMICONDUCTOR DEVICE

FIELD OF THE INVENTION

The present invention relates to a method for producing a semiconductor device having a double-stage recess that is effective for improvement in performance of high-power output GaAs FETs.

BACKGROUND OF THE INVENTION

FIGS. 9(a)–9(i) are sectional views illustrating process steps in a method for producing a field effect transistor (hereinafter, referred to as an FET) having a double-stage recess according to the prior art.

Initially, in the step of FIG. 9(a), an n type GaAs layer 2 is formed on a semi-insulating GaAs substrate 1 by epitaxial growth, and then a prescribed portion of the n type GaAs layer 2 is etched to a prescribed depth by anisotropic dry etching or wet etching to form a first stage recess 2a. Thereafter, an SiO film 4 is deposited over the entire surface of the wafer by plasma CVD, followed by patterning of a photoresist 5 on the SiO film 4.

In the step of FIG. 9(c), employing the photoresist pattern 5 as a mask, the SiO film 4 is selectively etched by reactive ion etching (RIE) and the n type GaAs layer 2 is selectively etched to a prescribed depth by anisotropic dry etching or wet etching to form a second stage recess 2b.

Thereafter, an SiO film 6 is deposited over the entire surface as shown in FIG. 9(d), and it is anisotropically etched to form side walls 6 on the both sides of the recess.

In the step of FIG. 9(f), WSi 7 and Au 8 are successively deposited over the surface of the structure by sputtering.

Next, in the step of FIG. 9(g), using a photoresist mask (not shown), Au 8 and WSi 7 are successively etched by ion-milling and RIE with a gas mixture of $CF_4$ and $O_2$, respectively.

Thereafter, the SiO film 4 and the side walls 6 are removed as shown in FIG. 9(h).

Finally, in the step of FIG. 9(i), source and drain electrodes 9 are formed to complete a semiconductor device.

In the prior art method, after patterning of the first stage recess 2a, the second stage recess 2b is patterned in the first stage recess 2a, so that mask alignment must be performed twice.

In the prior art double recess type FET, since the first and second stage recesses are formed using different masks, so mask alignment must be performed twice. Therefore, misalignment of the masks occurs, whereby the widths of the first stage recess and the second stage recess are different from design widths and vary from wafer to wafer.

SUMMARY OF THE INVENTION

It is an object of the present invention to provide an FET having a double-stage recess in which a first stage recess and a second stage recess are formed with high controllability of their widths, and a method for producing the double recess type FET.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method for producing a semiconductor device comprises preparing a semi-insulating substrate having an active layer, depositing a first insulating film on the active layer and forming desired two first openings in the first insulating film, depositing a second insulating film on the first insulating film so as to fill the first openings and make the surface of the first insulating film flat, removing a portion of the first made insulating between the first openings to form a second opening, etching the active layer to a prescribed depth through the second opening formed by the removal of the first insulating film, removing the second insulating films on the active layer to form a third opening, and etching the active layer through the third opening formed by removal of the second insulating film thereby to form a double-stage recess. Therefore, the widths of the first and second stage recesses are determined by the pattern of the first insulating film and the patterns of the first and second insulating films, respectively, so that only one alignment step is sufficient as well as the positions and the widths of the recess are easily controlled, thereby enhancing the degree of freedom in the recess width.

According to a second aspect of the present invention, in the above-described production method, the widths of the both first openings of the first insulating film are different from each other. Therefore, the positions and the widths of the first and second stage recesses are easily controlled, and the right and left side widths of the first stage recess can be arbitrarily set to different widths.

According to a third aspect of the present invention, a method for producing a semiconductor device comprises preparing a semi-insulating substrate having an active layer, depositing a first insulating film on the active layer and forming desired two first openings in the first insulating film, depositing a second insulating film on the first insulating film so as to fill the first openings and make the surface of the first insulating film flat, removing a portion of the first insulating film between the first openings to form a second opening, etching the active layer to a prescribed depth through the second opening formed by the removal of the first insulating film, removing one of the second insulating films on the active layer to form a third opening, etching the active layer through the third opening formed by the removal of the second insulating film, removing the other second insulating film on the active layer to form a fourth opening, and etching the active layer through the fourth opening formed by the removal of the second insulating film thereby to form a double-stage recess comprising upper and lower stage recesses in the active layer wherein the upper stage recess has different depths at the left and right sides. Therefore, the positions and the widths of the first and second stage recesses are easily controlled, and the right and left side widths and the depths of the first stage recess can be arbitrarily set to different widths and depths.

According to a fourth aspect of the preset invention, a method for producing a semiconductor device comprises preparing a semi-insulating substrate having an active layer, depositing a first insulating film on the active layer, depositing a refractory metal and a refractory silicide on the first insulating film, forming two first openings in the first insulating film, the refractory metal, and the refractory silicide, depositing a second insulating film on the first insulating film so as to fill the first openings and make the surface of the first insulating film flat, removing a portion of the first insulating film between the first openings to form a second opening, etching the active layer to a prescribed depth through the second opening formed by the removal of the first insulating film, removing the second insulating films on the active layer to form a third opening, and etching the active layer through the third opening formed by the removal of the second insulating films thereby to form a double-stage recess. Therefore, the spatter effect of the first insulating film is reduced and the openings can be filled with the second insulating films, thereby making the surface of the first insulating film flat. Thus, the first stage recess and the second stage recess are formed with high controllability for the positions.

According to a fifth aspect of the present invention, in the above-described production method, two pairs of the first openings are formed in the first insulating film arranged in a row. Therefore, the relative positions of the two double-stage recesses are determined by the pattern of the first insulating film and the patterns of the first and second insulating films, respectively, whereby only one alignment step is sufficient, and the two double-stage recesses are formed at arbitrary positions arranged in a row with high accuracy and high controllability for the relative positions, respectively.

According to a sixth aspect of the present invention, in the above-described production method, two pairs of the first openings are formed in the first insulating film so that those selected among the widths and the ratios of these openings are different between the two pairs of the first openings, thereby to form two double-stage recesses having different ones selected among the widths and the depths of the first stage recesses. Therefore, two double-stage recesses are formed at arbitrary positions arranged in a row with high accuracy and high controllability for the relative positions, and the right and left side widths and the depths of the first stage recess can be arbitrarily set to different widths and depths.

According to a seventh aspect of the present invention, the above-described production method further includes forming a fifth opening in the first insulating film simultaneously with the first openings, and etching the active layer through the fifth opening simultaneously with the etching of the active layer through the third opening, thereby to simultaneously form a single-stage recess and the double-stage recess. Therefore, the relative positions of the double-stage recess and the single-stage recess are determined by the pattern of the first insulating film and the patterns of the first and second insulating films, respectively, whereby only one alignment step is sufficient as well as the double-stage recess and the single-stage recess are formed at arbitrary positions arranged in a row with high accuracy and high controllability for the relative positions, respectively.

BRIEF DESCRIPTION OF THE DRAWINGS

FIGS. 1(a)–1(l) are sectional views illustrating process steps in a method for producing an FET according to a first embodiment of the present invention.

FIGS. 8(a)–8(g) are sectional views illustrating process steps in a method for producing an FET according to a seventh embodiment of the present invention.

FIGS. 9(a)–9(i) are sectional views illustrating process steps in a method for producing an FET according to the prior art.

DETAILED DESCRIPTION OF THE PREFERRED EMBODIMENTS

Embodiment 1

Figure 2:
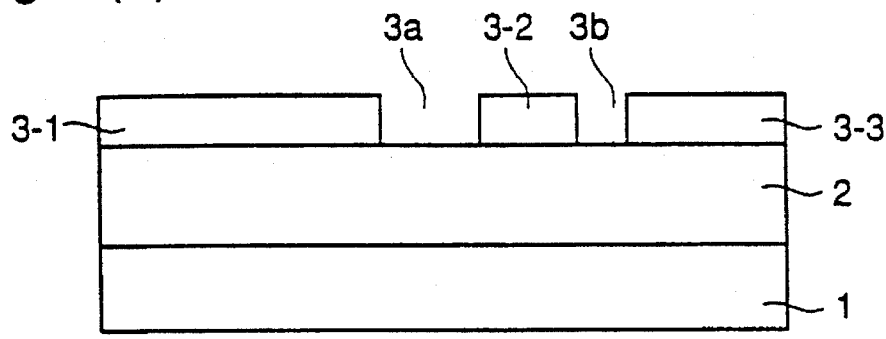
FIGS. 2(a)–2(c) are sectional views illustrating process steps in a method for producing an FET according to a second embodiment of the present invention.
Figure 2:
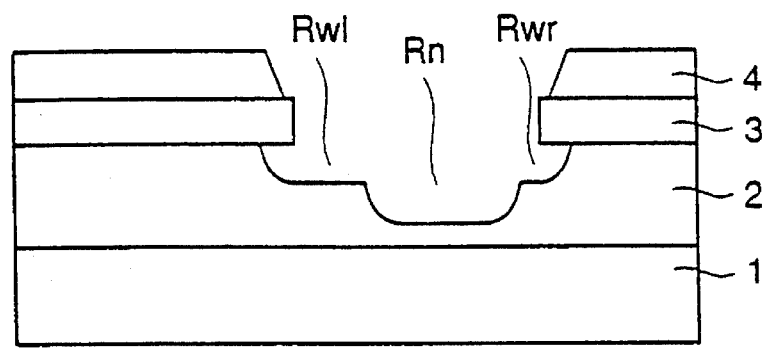
Figure 2:
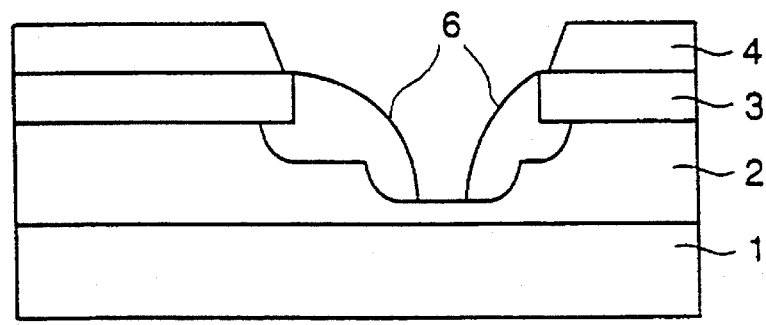

FIGS. 1(a)–1(l) are sectional views illustrating process steps in a method for producing an FET according to a first embodiment of the present invention.

In the step of FIG. 1(a), an n type GaAs layer 2 having a dopant concentration of 3.0E17 $cm^{-3}$ and a thickness of 3000 Å is formed on a semi-insulating GaAs substrate 1 by epitaxial growth, and a part of the n type GaAs layer other than a part where an FET is lately fabricated is etched away or insulated by ion implantation (not shown) to produce an active layer 2. In FIG. 1(a), only the active layer 2 is illustrated.

In the step of FIG. 1(b), an SiN film 3 2 μm thick, as a first insulating film, is deposited on the active layer 2 by plasma CVD (hereinafter, referred to as p-CVD). Then, a resist film 5 is deposited on the SiN film 3 and patterned for determining recess widths. The pattern includes a central resist portion 5-1 separated by spaces 5a and 5b from other parts of the resist film 5. More specifically, the width of the center resist 5-1 determines the width of a narrow recess Rn that is described later and the width including the center resist 5-1 and openings 5a and 5b on both sides of the center resist 5-1 determines the width of a wide recess Rw that is described later. Thereafter, employing the patterned resist 5 as a mask, openings 3a and 3b are formed in the SiN film 3 by RIE (Reactive Ion Etching) using $SF_6$ as shown in FIG. 1(c). SiN films 3-1, 3-2, and 3-3 which are left after the RIE serve as dummy patterns in subsequent processing.

In the step of FIG. 1(d), an SiO film 4, as a second insulating film, is deposited by ECR-CVD (Electron Cyclotron Resonance-CVD) or p-CVD so that the opening 3a between the SiN films 3-1 and 3-2 and the opening 3b between the SiN films 3-2 and 3-3 are filled with the insulating films 4-1 and 4-2, thereby making the surface of the SiN film flat.

In the step of FIG. 1(e), a second resist 5 is patterned so as not to cover the center SiN film 3-2 that is a dummy pattern for forming an opening for etching of a second stage recess but covers the SiN films 3-1 and 3-3.

In the step of FIG. 1(f), after removal of the center SiN film 3-2, by RIE using $SF_6$, the n type GaAs layer 2 is etched to a prescribed depth through the opening formed by the removal of the SiN film 3-2, using anisotropic dry etching with a gas mixture of $CF_3$ and $O_2$ or wet etching with tartaric acid. As a result of the etching, a shallow preliminary recess Rp for forming a narrow and deep second stage recess Rn described later is produced.

In the step of FIG. 1(g), after removal of the second resist 5, the SiO films 4-1 and 4-2 positioned on both sides of the removed SiO film 3-2 are removed using BHF (buffered hydrofluoric acid) solution. Thereafter, the n type GaAs layer 2 is etched to a prescribed depth by anisotropic dry etching with a gas mixture of $CF_3$ and $O_2$ or wet etching with tartaric acid, thereby forming a double-stage recess comprising a narrow recess Rn having a width of 0.8 μm and a depth of 2000 Å and a wide recess Rw having a width of 1.3 μm and a depth of 1100 Å.

In the step of FIG. 1(h), an SiO film 6 is deposited and patterned by anisotropic etching with a gas mixture of $CF_3$ and $O_2$ to form side walls 6 on both sides of the double recess.

Thereafter, in the step of FIG. 1(i), WSi 7 2000 Å thick and Au 8 4000 Å thick are successively deposited over the surface of the structure by sputtering.

In the step of FIG. 1(j), employing a photoresist (not shown) as a mask, the Au 8 and the WSi 7 are successively etched by ion-milling and RIE with a gas mixture of $CF_4$ and $O_2$, respectively, to form a gate electrode 0.5 μm wide.

In the step of FIG. 1(k), the SiO film 4, the SiN film 3, and the side walls 6 are removed.

Finally, in the step of FIG. 1(l), source and drain electrodes 9 are formed to complete a semiconductor device.

According to the first embodiment of the invention, the dummy pattern 3-2 comprising the first insulating film and the dummy patterns 4 sandwiching the dummy pattern 3-2 and comprising the second insulating film are disposed on the active layer 2 on the semi-insulating substrate 1. The active layer 2 is etched through the opening formed by the removal of the dummy pattern 3-2, thereby to form the preliminary recess Rp for forming the narrow and deep recess Rn. Further, the active layer 2 is etched through the opening formed by the removal of the dummy pattern 3-2 comprising the first insulating film and the removal of dummy patterns 4-1 and 4-2 comprising the second insulating film, thereby completing the double recess comprising the narrow and deep second stage recess Rn and the wide and shallow first stage recess Rw extending over both ends of the second recess Rn. The relative positions of both recesses Rn and Rw are determined by the width of the first insulating film 3-2 and the widths of the second insulating films 4-1 and 4-2 shown in FIGS. 1(a)–1(l), respectively, so that both recesses are formed with high accuracy and high controllability of their positions and the widths. Therefore, a double recess FET with improved controllability in the recess configuration is obtained, resulting in an FET with improved operating characteristics.

Embodiment 2

FIGS. 2(a)–2(c) are sectional views illustrating process steps in a method of producing an FET according to a second embodiment of the present invention.

In this second embodiment, the widths of the openings 3a and 3b are different from each other, i.e., the opening 3a is 1.5 μm wide and the opening 3b is 1 μm wide, as shown in FIG. 2(a) and, therefore, the widths of the recesses on the both sides of the gate region are 0.6 μm and 0.2 μm, respectively, as shown in FIG. 2(b) corresponding to FIG. 1(g).

Thereafter, through the same process steps as described with respect to FIGS. 1(i)–1(l), a double-stage recess having different widths at the left and right sides is obtained as shown in FIG. 2(b). Thereafter, side walls 6 are formed and a gate electrode and source and drain electrodes are formed, thereby completing a semiconductor device as shown in FIG. 2(c).

According to the second embodiment, since the dummy patterns 3-1, 3-2, and 3-3 comprising the first insulating film are formed so that the widths of the openings 3a and 3b are different, the first stage recess is formed with an arbitrary width at an arbitrary position asymmetric with respect to the second stage recess. In addition, both of the recesses are formed with high accuracy and high controllability of their positions and widths. Therefore, a double recess FET with improved controllability in recess configuration is obtained. As a result, an FET having a gate to drain distance longer than the gate to source distance, thereby increasing the drain breakdown voltage, is realized.

Embodiment 3

FIGS. 3(a)–3(g) are sectional views illustrating process steps in a method for producing an FET according to a third embodiment of the present invention.

Figure 3:
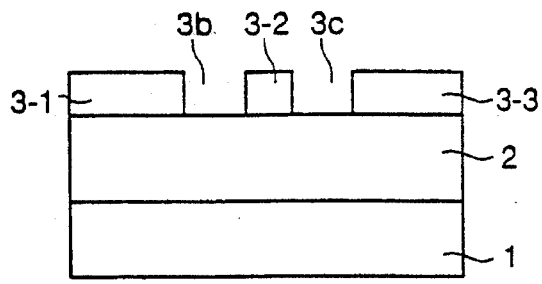
FIGS. 3(a)–3(g) are sectional views illustrating process steps in a method for producing an FET according to a third embodiment of the present invention.
Figure 3:
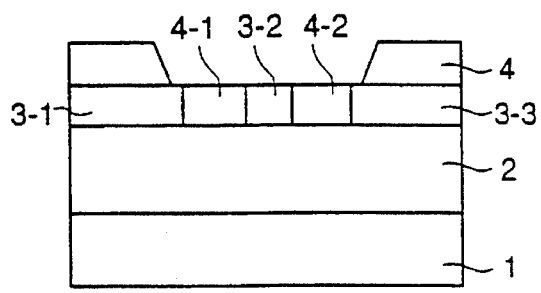
Figure 3:
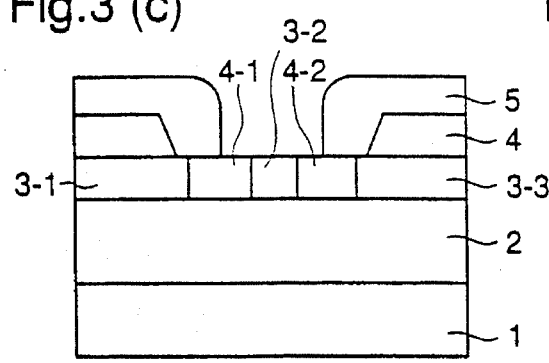
Figure 3:
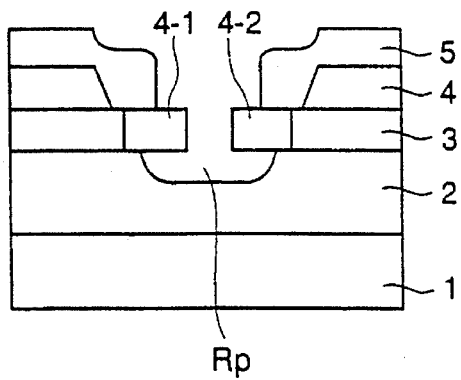
Figure 3:
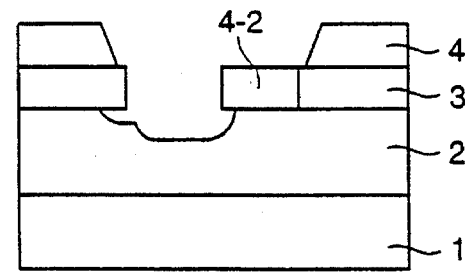
Figure 3:
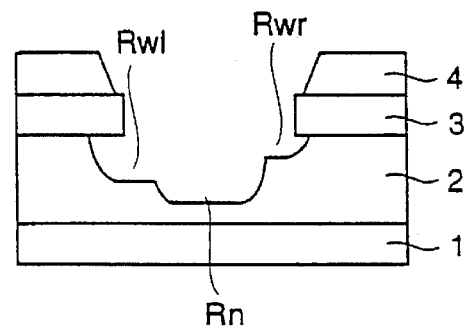
Figure 3:
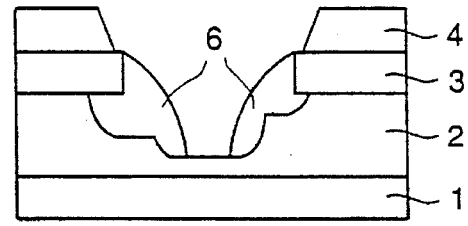

In this third embodiment, the process steps shown in FIGS. 3(a)–3(d) are identical to those already described with respect to FIGS. 1(a)–1(f). After the removal of the SiN film 3-2 and the etching of the n type GaAs layer 2 to a prescribed depth as shown in FIG. 3(d) corresponding to FIG. 1(f), the following process steps are performed.

After covering the one side SiO film 4-2 with resist, the other side SiO film 4-1 is removed with BHF solution. In the step of FIG. 3(e), the n type GaAs layer 2 is removed to a prescribed depth by anisotropic dry etching with a Gas mixture of $CHF_3$ and $O_2$ or by wet etching with tartaric acid. After removal of the resist, the remaining SiO film 4-2 is removed with BHF solution. Then, as shown in FIG. 3(f), the n type GaAs layer 2 is etched to a prescribed depth by anisotropic etching with a gas mixture of $CHF_3$ and $O_2$ or by wet etching with tartaric acid, thereby producing a double-stage recess having steps of different heights.

In the step of FIG. 3(g), side walls 6 are formed in the recess structure. To complete a semiconductor device, a gate electrode and source and drain electrodes are formed in the same process as described with respect to FIGS. 1(i)–1(l).

According to the third embodiment of the invention, the dummy pattern 3-2 comprising the first insulating film and the dummy patterns 4 sandwiching the dummy pattern 3-2 and comprising the second insulating film are disposed on the active layer 2 on the semi-insulating substrate 1. The active layer 2 is etched through the opening formed by the removal of the dummy pattern 3-2 to produce the preliminary recess Rp for forming a narrow and deep recess Rn. Next, the active layer 2 is etched through the opening formed by the removal of the dummy pattern 3-2 comprising the first insulating film and the dummy pattern 4-1 comprising the second insulating film. The active layer 2 is etched through the opening formed by the removal of the dummy pattern 4-2 comprising the second insulating film, thereby completing a double-stage recess comprising the narrow and deep second stage recess Rn and the first stage recesses Rwl and Rwr having different depths at opposite sides of the second stage recess Rn. The relative positions of the respective recesses Rn, Rwl, and Rwr are determined by the width of the first insulating film 3-2 and the widths of the second insulating films 4-1 and 4-2 shown in FIGS. 1(a)–1(l), so that respective recesses are formed with high accuracy and high controllability of positions and widths. Therefore, a double recess type FET with improved controllability in the recess configuration is obtained, resulting in an FET with improved operating characteristics.

Embodiment 4

Figure 4:
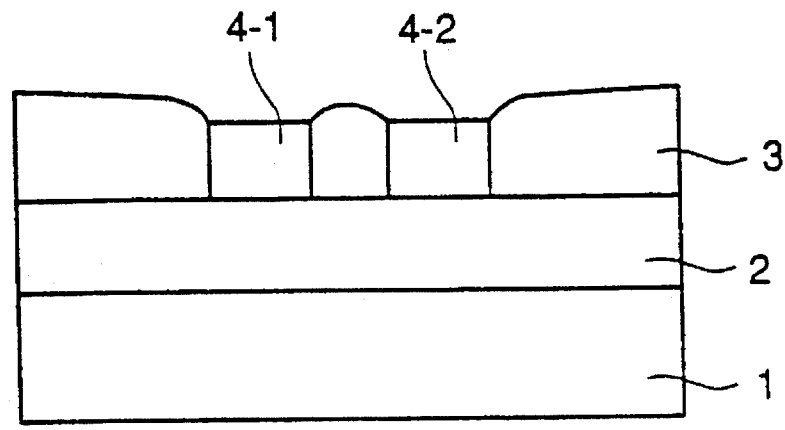
FIG. 4 is a sectional view illustrating a problem in the method according to any of the first to third embodiments.
Figure 5:
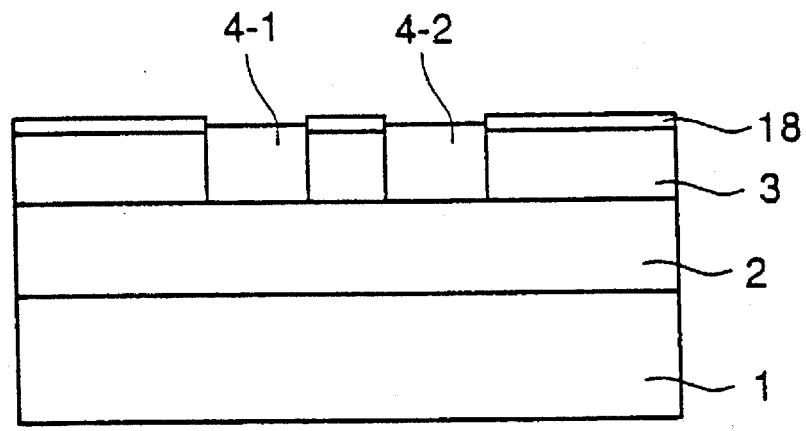
FIG. 5 is a sectional view illustrating a process step in a method for producing an FET according to a fourth embodiment of the present invention.

FIGS. 4 and 5 are sectional views illustrating process steps in a method for producing an FET according to a fourth embodiment of the present invention.

In the above-described first embodiment, when the SiO film 4 as the second insulating film is deposited by ECR-CVD or p-CVD and flattened as shown in FIG. 1(d), edges of the SiN films 3 are unfavorably rounded by a sputtering effect as shown in FIG. 4, thereby reducing positional and dimensional accuracy of the recess formed by the dummy pattern comprising the insulating film.

According to the fourth embodiment, in order to prevent rounding of edges of the SiN films 3 by sputtering effect, the SiN film 3 is deposited 2 μm thick on the active layer 2 by p-CVD and, thereafter, a refractory metal 18, such as W or Al, is deposited 2 μm thick on the SiN film 3, followed by deposition of the SiO film 4 by ECR-CVD or p-CVD and flattening of the surface of the structure. As a result, the rounding of edges of the SiN films 3 by sputtering effect is avoided, whereby reduction in the positional and dimensional accuracy of the recess that is formed using the dummy pattern comprising the insulating film is prevented, resulting in a semiconductor device having a recess structure with high controllability.

Embodiment 5

Figure 6:
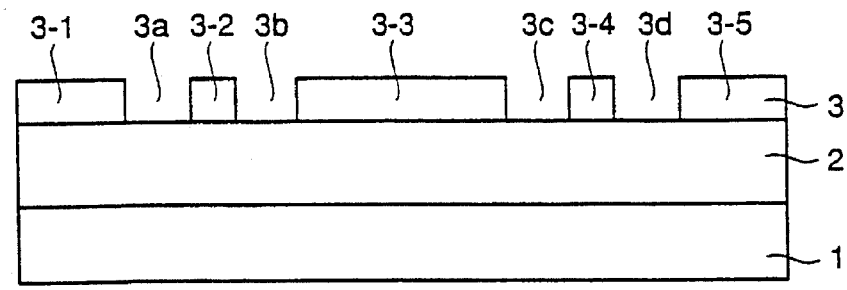
FIGS. 6(a)–6(d) are sectional views illustrating process steps in a method for producing an FET according to a fifth embodiment of the present invention.
Figure 6:
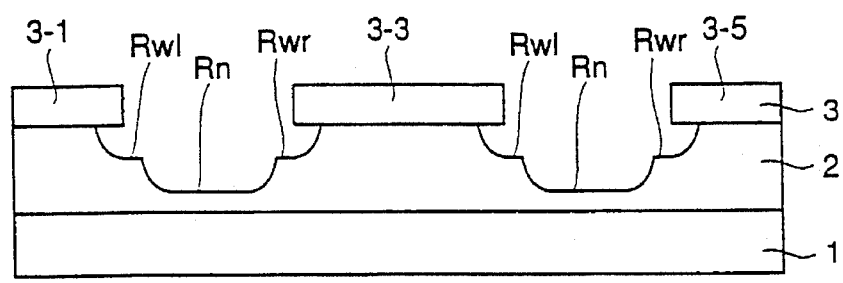
Figure 6:
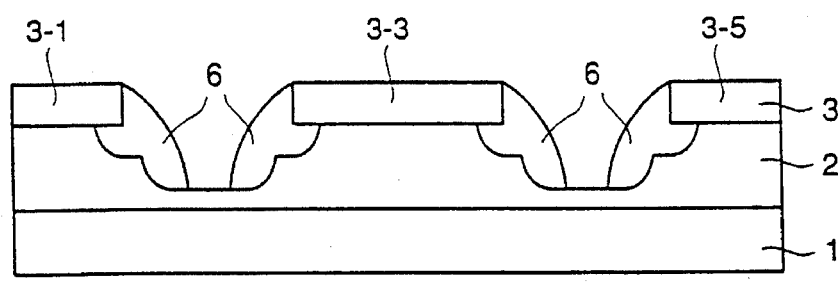
Figure 6:
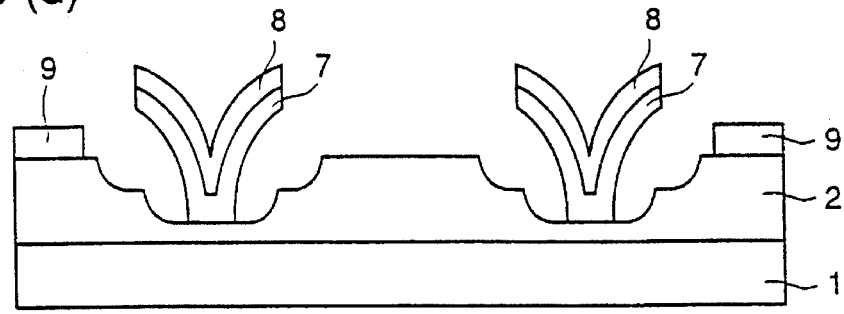

FIGS. 6(a)–6(d) are sectional views illustrating process steps in a method for producing an FET according to a fifth embodiment of the present invention. A pair of openings 3a and 3b, and another pair of openings 3c and 3d are produced spaced from to each other in arbitrary positions on the active layer 2 as shown in FIG. 6(a).

After the active layer 2 is formed on the GaAs substrate 1 as in the first embodiment, a pair of openings 3a and 3b, and another pair of openings 3c and 3d are produced at arbitrary positions on the active layer 2 arranged in a row as shown in FIG. 6(a), in the same process steps as described with respect to FIGS. 1(b) and 1(c).

When the same process steps as shown in FIGS. 1(d)–1(g) are performed to form the openings 3a and 3b and the openings 3c and 3d, two double-stage recesses are obtained at arbitrary positions arranged in a row as shown in FIG. 6(b) corresponding to FIG. 1(g).

Thereafter, in the step of FIG. 6(c), side walls 6 are formed in both the double-stage recesses in the same process steps as shown in FIGS. 1(h)–1(l). In the step of FIG. 6(d), gate electrodes comprising Au 8 and WSi 7 are formed in and the side walls 6 are removed from the double-stage recesses. Then, source and drain electrodes 9 are formed at positions sandwiching the double-stage recesses to complete a semiconductor device with dual-gate structure having two double-stage recesses.

According to the fifth embodiment of the invention, a dual-gate FET having two double-stage recesses with high accuracy and high controllability in positions and widths is obtained. Furthermore, since the double-stage recesses are patterned with masks comprising the same first insulating film 3, the relative positions of the two double-stage recesses are determined with high accuracy. As a result, a dual-gate FET having two double-stage recesses and having improved operating characteristics is realized.

Embodiment 6

Figure 7:
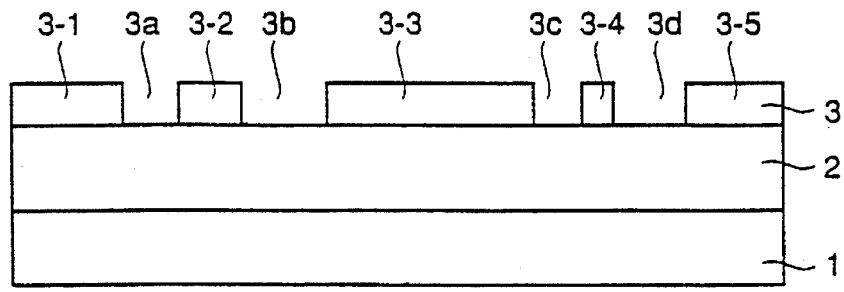
FIGS. 7(a)–7(d) are sectional views illustrating process steps in a method for producing an FET according to a sixth embodiment of the present invention.
Figure 7:
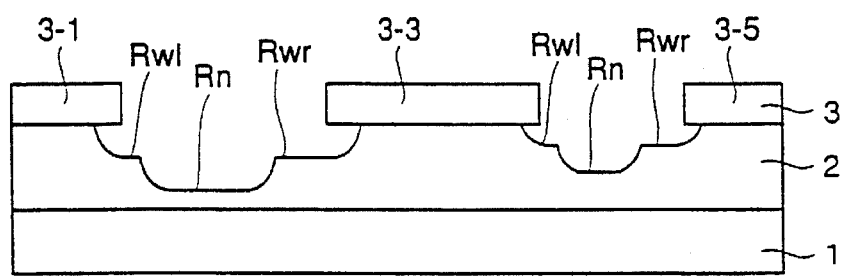
Figure 7:
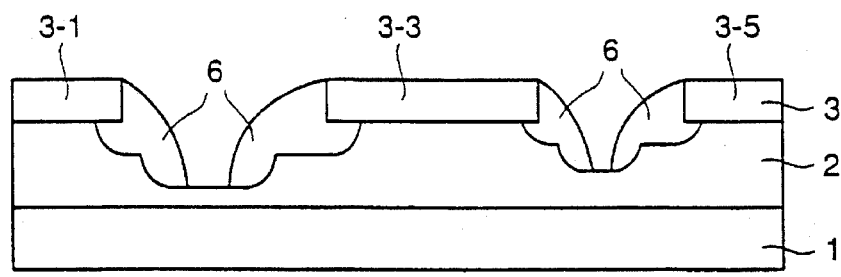
Figure 7:
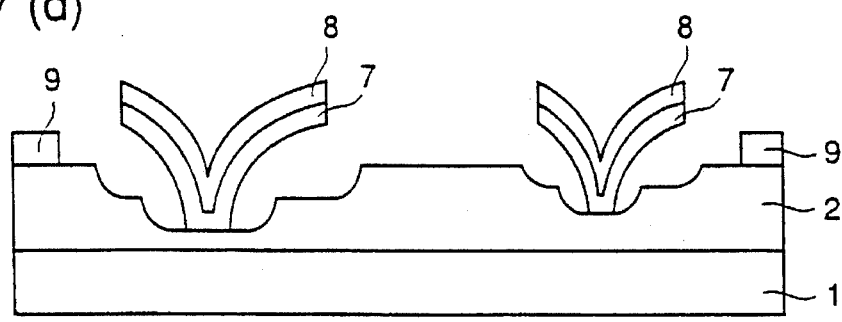

FIGS. 7(a)–7(d) are sectional views illustrating process steps in a method for producing an FET according to a sixth embodiment of the present invention. A pair of openings 3a and 3b and another pair of openings 3c and 3d are produced spaced from each other in arbitrary positions on the active layer 2 as shown in FIG. 7(a). The ratio of the width of the opening 3a to the width of the opening 3b is made different from the ratio of the width of the opening 3c to the width of the opening 3d. Alternatingly, the width of the opening 3a is made different from the width of the opening 3c even though the ratios of the widths of the two pairs of openings are the same so that the width of the opening 3b is different from the width of the opening 3d.

After the active layer 2 is formed on the GaAs substrate 1, a pair of openings 3a and 3b and another pair of openings 3c and 3d are produced at arbitrary positions on the active layer 2 arranged in a row as shown in FIG. 7(a), in the same process steps as shown in FIGS. 1(b) and 1(c).

In this sixth embodiment, the ratio of the width of the opening 3a to the width of the opening 3b is made different from the ratio of the width of the opening 3c to the width of the opening 3d. Alternatively, the width of the opening 3a is made different from the width of the opening 3c even though the ratios of the widths of the two pairs of openings are the same so that the width of the opening 3b is different from the width of the opening 3d.

When the same process steps as shown in FIGS. 1(d)–1(g) are performed to the openings 3a and 3b and the openings 3c and 3d, two double-stage recesses having different widths or depths for the first stage recesses are obtained at arbitrary positions arranged in a row as shown in FIG. 7(b) corresponding to FIG. 1(g).

Thereafter, in the step of FIG. 7(c), side walls 6 are respectively formed in the two respective double-stage recesses having different configurations, in the same process steps as shown in FIGS. 1(h)–1(l). Thereafter, in the step of FIG. 7(d), gate electrodes comprising Au 8 and WSi 7 are formed in and the side walls 6 are removed from the double-stage recesses. Then, source and drain electrodes 9 are formed on positions sandwiching two double-stage recesses, thereby completing a semiconductor device with dual-gate structure having two double-stage recesses having different configurations.

According to the sixth embodiment of the invention, a dual-gate FET having two double-stage recesses with high accuracy and high controllability in positions and widths is obtained. Since the openings 3a and 3b and the openings 3c and 3d having different widths or width ratios are formed, two double-stage recesses having different widths or depths for the first stage recesses are obtained. Furthermore, since the double-stage recesses are patterned with masks comprising the same first insulating film 3, the relative positions of the two double-stage recesses are determined with high accuracy. As a result, a dual-gate FET having two double-stage recesses, in which the widths of the first stage recesses are different, and having improved operating characteristics is realized.

Embodiment 7

FIGS. 8(a)–8(g) are sectional views illustrating process steps in a method for producing an FET according to a seventh embodiment of the present invention. A pair of openings 3a and 3b and an opening 3c are produced, arranged in a row, as shown in FIG. 8(a).

After the active layer 2 is formed on the GaAs substrate 1 as in the first embodiment, an SiN film 3 as a first insulating film is deposited on the active layer 2. Next, employing a resist (not shown) having prescribed openings as a mask, a pair of openings 3a and 3b and an opening 3c are produced, arranged in a row, in the SiN film 3 by RIE. SiN films 3-1, 3-2, 3-3, and 3-4 left after the RIE serve as dummy patterns.

In the step of FIG. 8(c), after an SiO film 4 as a second insulating film is deposited, the opening 3a between the SiN films 3-1 and 3-2, the opening 3b between the SiN films 3-2 and 3-3, and the opening 3c between the SiN films 3-3 and 3-4 are filled with insulating films 4-1, 4-2, and 4-3, respectively, thereby making the surface of the SiN film flat.

In the step of FIG. 8(c), a resist 5 is patterned so that the SiN films 3-1, 3-3, and 3-4 are covered while the center SiN film 3-2 that is a dummy pattern for forming an opening through which etching of a second stage recess is later carried out is exposed.

In the step of FIG. 8(d), after removal of the center SiN film 3-2, the n type GaAs layer 2 is etched to a prescribed depth through the opening formed by the removal of the SiN film 3-2, thereby producing a shallow preliminary recess Rp for forming a narrow and deep second-stage recess Rn.

In the step of FIG. 8(e), the resist pattern 5 is removed, and the SiO films 4-1 and 4-2 positioned at both sides of the removed SiO film 3-2 and the SiO film 4-3 filling in the opening 3c are removed. Thereafter, the n type GaAs layer 2 is etched to a prescribed depth, thereby completing a double-stage recess comprising a narrow recess Rn and a wide recess Rw and a single-stage recess R having the same width as the wide recess Rw and arranged in a row with the double-stage recess.

Thereafter, in the step of FIG. 8(f), side walls 6 are formed in both the double-stage recess and the single-stage recess in the same process steps as shown in FIGS. 1(h)–1(l). In the step of FIG. 8(g), gate electrodes comprising Au 8 and WSi 7 are formed in and the side walls 6 are removed from the double-stage recess and the single-stage recess, respectively. Then, source and drain electrodes 9 are formed at positions sandwiching the double-stage recess and the single-stage recess, thereby completing a semiconductor device with dual-gate structure having the double-stage recess and the single-stage recess.

According to the seventh embodiment of the invention, the double-stage recess with high accuracy and high controllability of positions and widths is formed according to the process steps described in the first embodiment and in its second etching step, the single-stage recess is formed, thereby realizing a dual-gate FET having the double-stage recess and the single-stage recess. Further, since the double-stage recess and the single-stage recess are patterned with masks comprising the same first insulating film 3, the relative positions of the double-stage recess and the single-stage recess are determined with high accuracy. As a result, a dual-gate FET having the double-stage recess and the single-stage recess and having improved operating characteristics is realized.

What is claimed is:

1. A method for producing a semiconductor device comprising:

preparing a semi-insulating substrate having an active layer;

depositing a first insulating film on the active layer and forming two first openings in the first insulating film;

depositing a second insulating film on the first insulating film to fill the first opening and make a flat surface with the first insulating film;

removing a portion of the first insulating film between the first openings to form a second opening;

etching the active layer to a depth through the second opening;

removing portions of the second insulating film from the active layer adjacent the second opening to form a third opening; and etching the active layer through the third opening to form a double-stage recess in the active layer.

2. The method of claim 1 wherein the widths of the two first openings in the first insulating film are different from each other.

3. A method for producing a semiconductor device comprising:

preparing a semi-insulating substrate having an active layer;

depositing a first insulating film on the active layer and forming two first openings in the first insulating film;

depositing a second insulating film on the first insulating film to fill the first opening and make a flat surface with the first insulating film;

removing a portion of the first insulating film between the first openings to form a second opening;

etching the active layer to a depth through the second opening;

removing a portion of the second insulating film on only a first side of the second opening from the active layer to form a third opening; and etching the active layer through the third opening;

removing a portion of the second insulating film on a second side of the second opening from the active layer to form a fourth opening; and etching the active layer through the fourth opening to form a double-stage recess comprising upper and lower stages in the active layer wherein the upper stage has different depths at opposite sides.

4. A method for producing a semiconductor device comprising:

preparing a semi-insulating substrate having an active layer;

depositing a first insulating film on the active layer;

depositing a refractory metal and a refractory silicide on the first insulating film;

forming two first openings in the first insulating film, the refractory metal, and the refractory silicide;

depositing a second insulating film on the first insulating film to fill the first opening and make a flat surface with the surface of the first insulating film;

removing a portion of the first insulating film between the first openings to form a second opening;

etching the active layer to a depth through the second opening;

removing portions of the second insulating film from the active layer adjacent the second opening to form a third opening; and etching the active layer through the third opening to form a double-stage recess in the active layer.

5. The method of claim 1 wherein two pairs of the first openings are formed in the first insulating film.

6. The method of claim 1 wherein two pairs of the first openings having widths are formed in the first insulating film so that at least one of the widths and ratios of the widths are different for the two pairs of the first openings to form two double-stage recesses having at least one of different widths and depths in first stages.

7. The method of claim 1 further including:

forming a fourth opening in the first insulating film simultaneously with forming the first openings; and etching the active layer through the fourth opening simultaneously with the etching of the active layer through the third opening to form simultaneously a single-stage recess and the double-stage recess.

* * * * *